(12) United States Patent
Lee et al.

(10) Patent No.: US 8,283,251 B2
(45) Date of Patent: Oct. 9, 2012

(54) METHOD OF MANUFACTURING WAFER LEVEL PACKAGE

(75) Inventors: Seung Seoup Lee, Yongin-si (KR); Sung Yi, Suwon-si (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 0 days.

(21) Appl. No.: 13/137,984

(22) Filed: Sep. 22, 2011

(65) Prior Publication Data

US 2012/0015500 A1    Jan. 19, 2012

Related U.S. Application Data

(62) Division of application No. 12/289,702, filed on Oct. 31, 2008.

(30) Foreign Application Priority Data

Sep. 3, 2008  (KR) .................. 10-2008-0086737

(51) Int. Cl.
*H01L 21/44* (2006.01)
(52) U.S. Cl. ......... 438/671; 438/455; 438/584; 257/738
(58) Field of Classification Search .................. 438/584, 438/671, 455
See application file for complete search history.

(56) References Cited

U.S. PATENT DOCUMENTS

| | | | |
|---|---|---|---|
| 6,400,172 B1 | 6/2002 | Akram et al. | |
| 6,469,394 B1 | 10/2002 | Wong et al. | |
| 2003/0227079 A1 | 12/2003 | Chia et al. | |
| 2008/0174012 A1 | 7/2008 | Otsuki | |

FOREIGN PATENT DOCUMENTS

| | | |
|---|---|---|
| JP | 11-168116 | 6/1999 |
| JP | 2001-284381 | 10/2001 |
| KR | 10-2005-0058722 | 6/2005 |

OTHER PUBLICATIONS

U.S. Patent Final Office Action mailed Dec. 2, 2011 in U.S. Appl. No. 12/289,702.
U.S. Patent Office Action mailed Mar. 27, 2012 in U.S. Appl. No. 12/289,702.
U.S. Patent Restriction Requirement mailed Feb. 23, 2011 in corresponding U.S. Appl. No. 12/289,702.
U.S. Patent Office Action mailed Jun. 10, 2011 in corresponding U.S. Appl. No. 12/289,702.
Japanese Office Action issued Apr. 5, 2011 in corresponding Japanese Patent Application No. 2008-287748.
U.S. Appl. No. 12/289,702, filed Oct. 31, 2008, Seung Seoup Lee et al., Samsung Electro-Mechanics Co., Ltd.

*Primary Examiner* — Thao Le
*Assistant Examiner* — Geoffrey Ida

(57) ABSTRACT

A method for manufacturing a wafer level package including: forming a redistribution line connected to a top surface of a die pad on a wafer with the die pad; additionally preparing a carrier film including a metal post with a concave central portion on one surface; bonding the metal post to a top surface of the redistribution line; molding a space between the metal posts with a molding resin; and removing the carrier film.

4 Claims, 7 Drawing Sheets

METHOD OF MANUFACTURING WAFER LEVEL PACKAGE

CROSS-REFERENCE TO RELATED APPLICATIONS

This application is a U.S. divisional application filed under 37 CFR 1.53(b) claiming priority benefit of U.S. Ser. No. 12/289,702 filed in the United States on Oct. 31, 2008, which claims earlier priority benefit to Korean Patent Application No. 10-2008-0086737 filed with the Korean Intellectual Property Office on Sep. 3, 2008 the disclosures of which are incorporated herein by reference.

BACKGROUND

1. Field

The present invention relates to a wafer level package and a method of manufacturing the same; and, more particularly, to a wafer level package including a metal post with a flexure hinge structure and a method of manufacturing the same.

2. Description of the Related Art

A packaging process includes many unit processes, for example, chip attaching, wire bonding, molding, trimming/forming or the like, and so a conventional method of manufacturing a package to perform the packaging process by each chip has a disadvantage of needing a very long time for packaging all chips when considering the number of the chips obtained from one wafer.

Therefore, recently, there has been suggested a method of manufacturing an individual package by firstly performing the packaging process in a wafer state and then cutting a wafer along a dicing line. The package manufactured by this method is referred to as a wafer level package.

The wafer level package has advantages of manufacturing the package as a finished product in a state of not separating individual chips from the wafer and using existing wafer manufacturing equipment and processes for manufacture equipment or processes used in manufacturing the package.

In the wafer level package according to the prior art, a molding resin such as an EMC (Epoxy Molding Compound) and a metal post connected to a die pad of the wafer are formed on the wafer and a solder ball is formed on a top surface of the metal post in a state of not dividing the wafer to the individual chips.

In the wafer level package according to the prior art, the metal post is generally formed in a cylindrical shape and used in a state of having large compliance by increasing a height of the metal post to improve reliability, however, in this case, a thickness of the entire molding resin is increased and a process cost is rising due to increment of a plating amount in a plating process for forming the metal post.

SUMMARY

The present invention has been invented in order to overcome the above-described problems and it is, therefore, an object of the present invention to provide a wafer level package capable of reducing a process cost without the need for increasing a height of a metal post and allowing a metal post to play a role of a buffer to deformation of the package due to a CTE (Coefficient of Thermal Expansion) mismatch between the wafer level package and a wiring substrate by forming the metal post in a flexure hinge structure, and a method of manufacturing the same.

In accordance with one aspect of the present invention to achieve the object, there is provided a wafer level package including a wafer having a die pad; a redistribution line formed to be connected on a top surface of the die pad; a metal post connected to a top surface of the redistribution line and formed in a flexure hinge structure; and a molding resin formed between the metal posts.

Herein, the flexure hinge structure of the metal post may have a concave central portion.

And, the flexure hinge structure of the metal post may have a curved side surface and is spread upward.

Further, the wafer level package may further include a protection layer which is formed between the wafer and the redistribution line and has a via hole to expose a portion of a top surface of the die pad.

Further, the wafer level package may further include an external connection device formed at a top surface of the metal post.

Further, the external connection device may be a solder ball.

And, in accordance with another aspect of the present invention to achieve the object, there is provided a method for manufacturing a wafer level package including the steps of: forming a redistribution line connected to a top surface of a die pad on a wafer with the die pad; additionally preparing a carrier film having a metal post with a concave central portion on one surface; bonding the metal post to a top surface of the redistribution line; molding a space between the metal posts with a molding resin; and removing the carrier film.

Herein, the step of additionally preparing the carrier film having the metal post with the concave central portion includes the steps of: separately preparing a first silicon substrate and a second silicon substrate; separately forming first and second metal post filling spaces which have curved side surfaces and are spread upward by etching portions of the first and second silicon substrates; forming a silicon mold with a metal post filling space of which a central portion is concave by bonding the first silicon substrate to the second silicon substrate to contact bottom surfaces thereof to each other; adhering a carrier film coated with metal to one surface of the silicon mold; forming a metal post by plating the metal post filling space of the silicon mold with metal; and selectively removing the silicon mold.

Further, in the step of separately forming the first and second metal post filling spaces which have the curved side surfaces and are spread upward by etching portions of the first and second silicon substrates, the first and second silicon substrates may be etched by an RIE (Reactive Ion Etching) method.

Further, before forming the redistribution line, the method may further include a step of: forming a protection layer including a via hole to expose a portion of a top surface of a die pad on a wafer with the die pad.

Further, after removing the carrier film, the method may further include a step of: forming an external connection device on a top surface of the metal post.

And, in accordance with still another aspect of the present invention to achieve the object, there is provided a method for manufacturing a wafer level package including the steps of: forming a redistribution line connected to a top surface of a die pad on a wafer with the die pad; forming a molding resin with a metal post filling space, which exposes a portion of a top surface of the redistribution line, has a curved side surface, and is spread upward, on an upper part of the wafer having the redistribution line; and forming a metal post by plating the metal post filling space with metal.

Herein, the step of forming the molding resin with the metal post filling space may include the steps of: forming the molding resin on the entire surface of the wafer having the redistribution line; and imprinting the molding resin by using a mold provided with an uneven portion of the same shape as that of the metal post filling space on the surface.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DESCRIPTION OF EMBODIMENTS

Hereinafter, a matter regarding to an operation effect including a technical configuration to achieve the object of a wafer level package and a method of manufacturing the same in accordance with the present invention will be appreciated clearly through the following detailed description with reference to the accompanying drawings illustrating preferable embodiments of the present invention.

A Structure of a Wafer Level Package

First of all, a wafer level package in accordance with an embodiment of the present invention will be described in detail with reference to FIG. 1 to FIG. 4.

Figure 1:
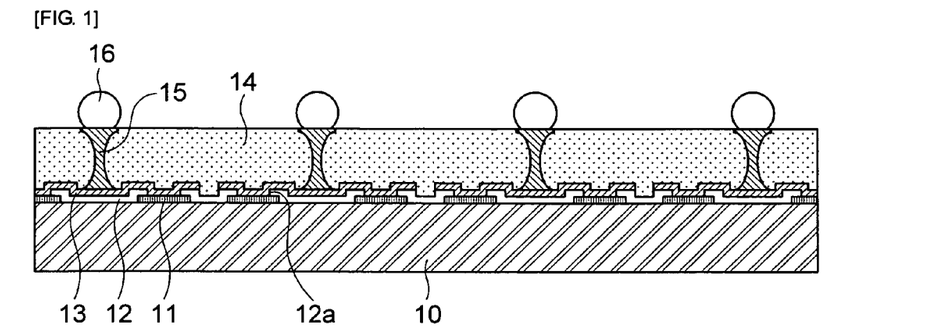
FIG. 1 is a cross sectional view illustrating a structure of a wafer level package in accordance with an embodiment of the present invention.
Figure 2:
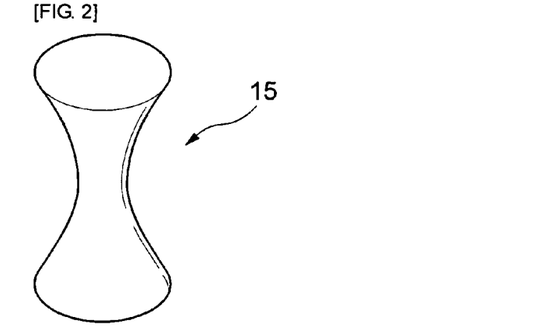
FIG. 2 and FIG. 3 are perspective views illustrating structures of metal posts in accordance with the embodiment of the present invention.
Figure 3:
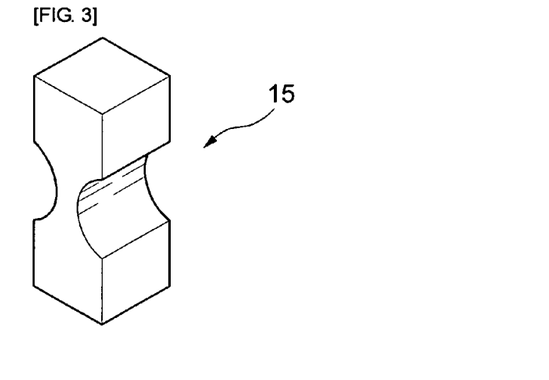
Figure 4:
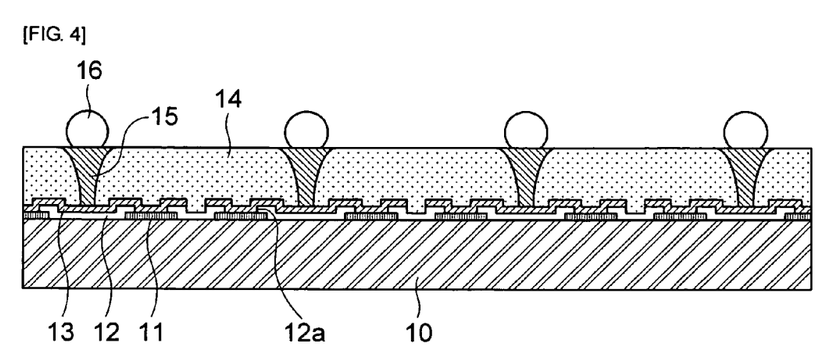
FIG. 4 is a cross sectional view illustrating a structure of a wafer level package in accordance with another embodiment of the present invention.

FIG. 1 is a cross sectional view illustrating a structure of a wafer level package in accordance with an embodiment of the present invention, FIG. 2 and FIG. 3 are perspective views illustrating structures of metal posts in accordance with the embodiment of the present invention, FIG. 4 is a cross sectional view illustrating a structure of a wafer level package in accordance with another embodiment of the present invention, FIG. 5 to FIG. 13 are cross sectional views sequentially illustrating a method of manufacturing a wafer level package in accordance with an embodiment of the present invention and FIG. 14 to FIG. 21 are cross sectional views sequentially illustrating a method of manufacturing a wafer level package in accordance with another embodiment of the present invention.

First of all, as shown in FIG. 1, the wafer level package in accordance with the embodiment of the present invention, includes a wafer 10 with a plurality of die pads 11 on one surface, a protection layer 12 which is formed on the wafer 10 and has via holes 12a to expose a portion of a top surface of each of the die pads 11, a distribution line 13 formed on the protection layer 12 to be connected to the top surfaces of the die pads 11 exposed by the via holes 12a, and metal posts 15 connected to a top surface of the distribution line 13.

Herein, the wafer 10 may use a silicon wafer or the like and the die pads 11 may be made of aluminum (Al) or the like.

The protection layer 12 may be formed by polyimide, a silicon nitride layer, a silicon oxide layer or the like.

The redistribution line 13 may be made of metal such as copper.

Further, the metal posts 15 may be formed through copper-plating or the like.

And, a molding resin 14, which is made of epoxy resin or the like, is formed between the metal posts 15.

An external connection device 16 for connection to a wiring substrate (not shown in the drawing) is formed on a top surface of the metal post 15. The external connection device 16 may be formed by a solder ball or the like.

Particularly, in the wafer level package in accordance with the embodiment of the present invention, the metal post 15 may have a flexure hinge structure.

Herein, the flexure hinge structure of the metal post 15, as shown in FIG. 1, may have a concave central portion.

For example, FIG. 2 and FIG. 3 are perspective views illustrating the structures of the metal posts in accordance with the embodiment of the present invention and the metal post 15, as shown in FIG. 2, may have a two-axis circular type flexure hinge structure in which a side surface is curved and a central portion is concave or as shown in FIG. 3, have a one-axis elliptical type flexure hinge structure in which a central side surface is curved and concave.

Further, although not shown in the drawings, the metal post 15 may have a one-axis circular type or two-axis elliptical type flexure hinge structure or the like as well as the above-mentioned structures.

Further, the flexure hinge structure of the metal post 15, as shown in FIG. 4, has a curved side surface and is spread upward.

As described above, in the wafer level package in accordance with the embodiment of the present invention, the metal post 15 can play a role of a buffer for preventing deformation of the package due to a CTE mismatch between the wafer level package and a wiring substrate (not shown in the drawings) although the metal post 150 is formed at a low height without the need for increasing the height of the metal post 15 by changing the structure of the metal post 15 into the flexure hinge structure with the concave central portion, and so on unlike a conventional cylindrical structure.

Therefore, the present invention has an advantage of securing reliability of the wafer level package without increasing the height of the metal post 15.

Further, the metal post 15 of the wafer level package in accordance with the embodiment of the present invention has excellent buffering capability to external impact by having the above-mentioned flexure hinge structure, thereby improving reliability of a drop test or the like.

And, it is possible to reduce a material cost and a time of a plating process in comparison with the cylindrical structure of the conventional metal post.

A Method of Manufacturing a Wafer Level Package

Hereinafter, a method of manufacturing the wafer level package shown in FIG. 1 will be described in detail with reference to FIG. 5 to FIG. 13.

FIG. 5 to FIG. 13 are cross sectional views sequentially illustrating the method of manufacturing the wafer level package in accordance with an embodiment of the present invention.

First of all, although not shown in the drawings, a wafer 10 with die pads 11 on one surface is prepared. Then, after forming a protection layer 12 on the wafer with the die pads 11, via holes 12a are formed to expose a portion of a top surface of each of the die pads 11 by removing a portion of the protection layer 12.

Then, a redistribution line 13, which is connected to top surfaces of the die pads 11, is formed on the protection layer 12 including the via holes 12a.

Figure 5:
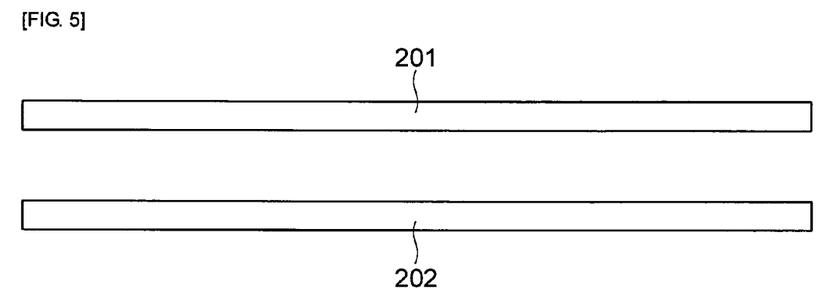
FIG. 5 to FIG. 13 are cross sectional views sequentially illustrating a method of manufacturing a wafer level package in accordance with an embodiment of the present invention.

As described above, after forming the redistribution line 13 connected to the top surfaces of the die pads 11 on the wafer 10 with the die pads 11, as shown in FIG. 5, a first silicon substrate 201 and a second silicon substrate 202 are prepared separately.

Figure 6:
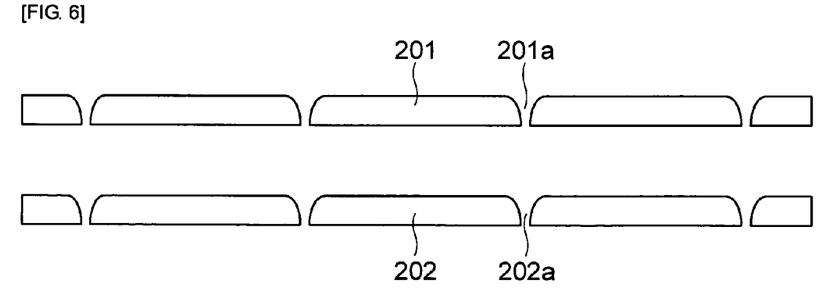

Then, as shown in FIG. 6, first and second metal post filling spaces 201a and 202a, which have curved side surfaces and are spread upward, are separately formed by etching portions of the first and second silicon substrates 201 and 202 by an RIE method or the like.

Figure 7:
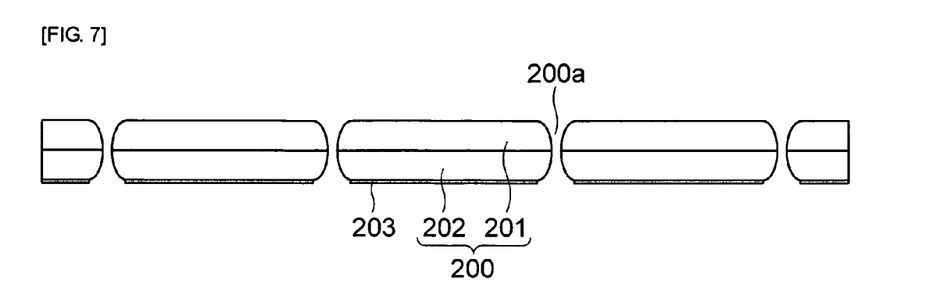

Then, as shown in FIG. 7, silicon molds 200 are formed to have metal post filling spaces 200a of which central portions are concave by bonding the first silicon substrate 201 to the second silicon substrate 202 to contact bottom surfaces thereof to each other.

Then, an adhesive 203 is coated on the one surfaces of the silicon molds 200.

Figure 8:
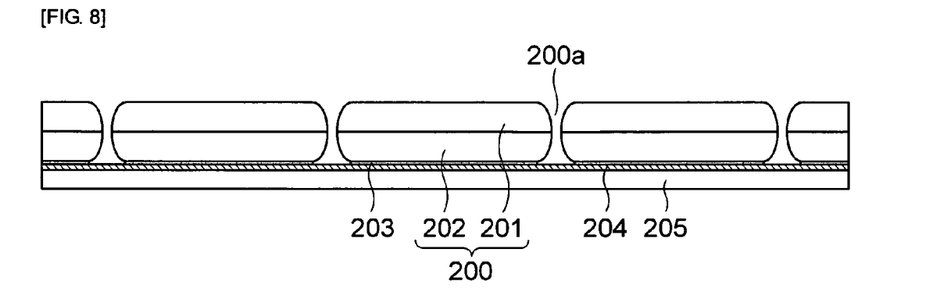

Then, as shown in FIG. 8, a carrier film 205 coated with metal 204 is adhered to the one surfaces of the silicon molds 200. At this time, the metal 204 is positioned to be in contact with the surfaces of the silicon molds 200.

The metal 204 may play a role of a plating seed layer in the following metal plating process. The carrier film 205 may be made of resin or the like.

Figure 9:
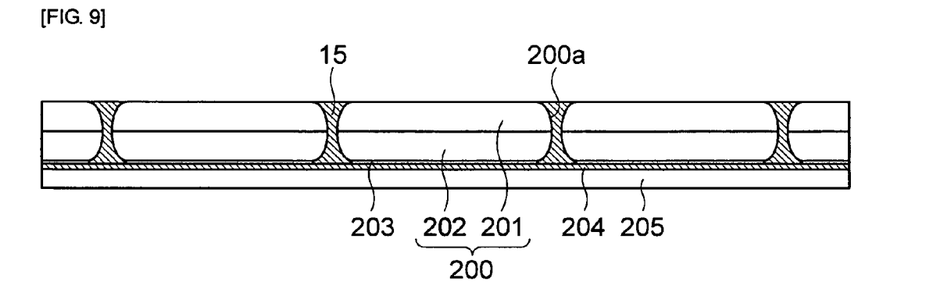

Then, as shown in FIG. 9, the metal post filling spaces 200a of the silicon molds 200 are plated with metal such as copper (Cu), thus forming metal posts 15 of which central portions are concave.

Figure 10:
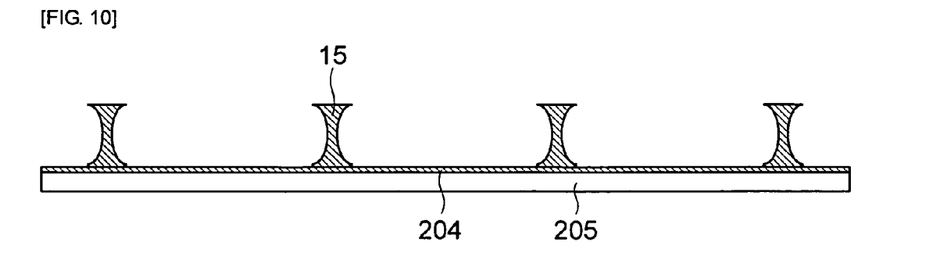

Then, as shown in FIG. 10, the silicon molds are selectively etched and removed, thus preparing the carrier film 205 which includes the metal posts 15 with the concave central portions on one surface.

Figure 11:
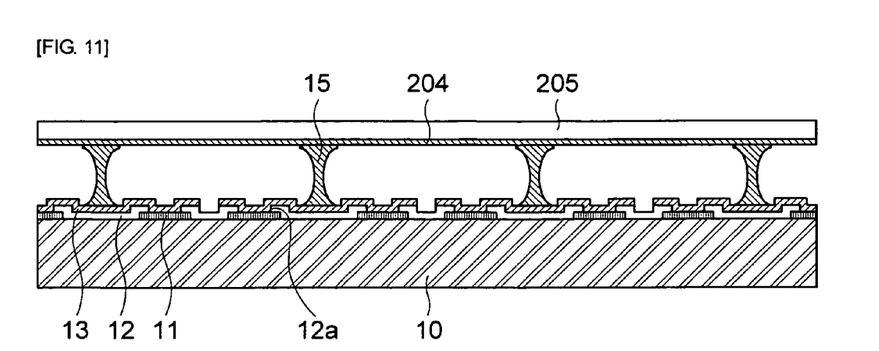

Then, as shown in FIG. 11, the metal posts 15 formed on the carrier film 205 are bonded to a top surface of the previously prepared redistribution line 13 of the wafer 10.

Figure 12:
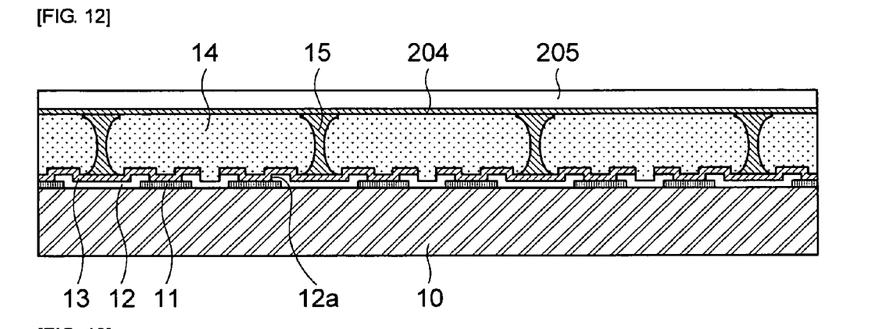

Then, as shown in FIG. 12, spaces between the metal posts 15 are molded with a mold resin 14.

Figure 13:
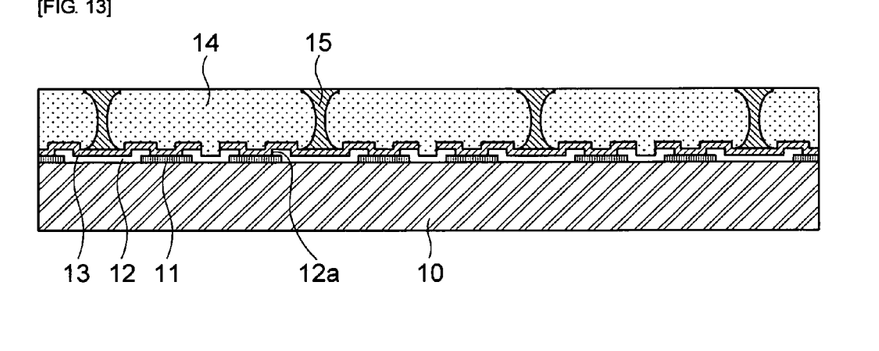

Then, as shown in FIG. 13, the carrier film 205 including the metal 204 is removed. Then, as shown in the above-mentioned FIG. 1, an external connection device 16 for connection to a wiring substrate (not shown) is formed on a top surface of the metal post 15.

As described above, in accordance with the embodiment of the present invention, it is possible to reduce a material cost of the metal post 15 or the like by forming the central portion of the metal post 15 in a concave shape, thereby reducing a manufacture cost of the wafer level package.

Further, the metal post 15 with the concave central portion can play a role of a buffer to deformation of the package due to a GTE mismatch between the wafer level package and the wiring substrate.

Hereinafter, a method of manufacturing the wafer level package shown in the above-mentioned FIG. 4 will be described in detail with reference to FIG. 14 to FIG. 21.

FIG. 14 to FIG. 21 are cross sectional views sequentially illustrating the method of manufacturing the wafer level package in accordance with another embodiment of the present invention.

Figure 14:
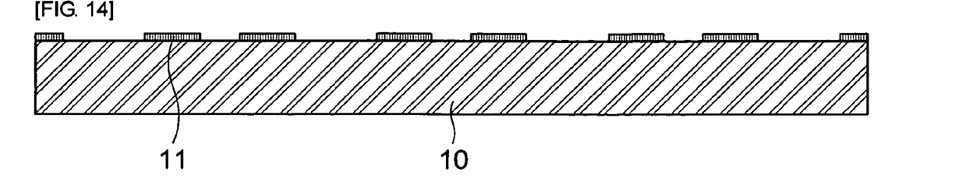
FIG. 14 to FIG. 21 are cross sectional views sequentially illustrating a method of manufacturing a wafer level package in accordance with another embodiment of the present invention.

First of all, as shown in FIG. 14, a wafer 10 with die pads 11 on one surface is prepared.

Figure 15:
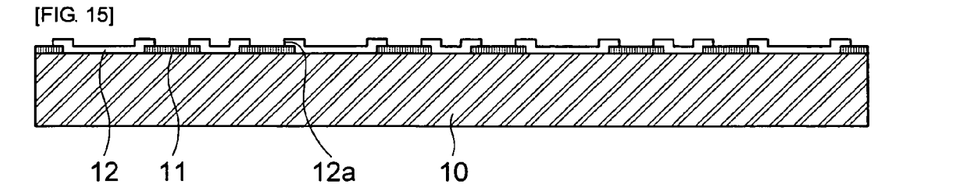

Then, as shown in FIG. 15, after forming a protection layer 12 on the entire upper part of the wafer 10 with the die pads 11, via holes 12a are formed to expose a portion of a top surface of each of the die pads 11 by removing a portion of the protection layer 12.

Figure 16:
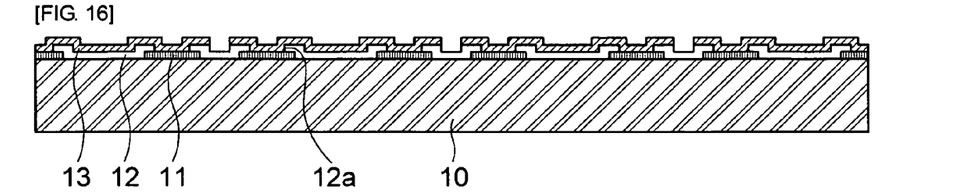

Then, as shown in FIG. 16, a redistribution line 13, which is connected to the top surfaces of the die pads 11, is formed on the protection layer including the via holes 12a.

Figure 17:
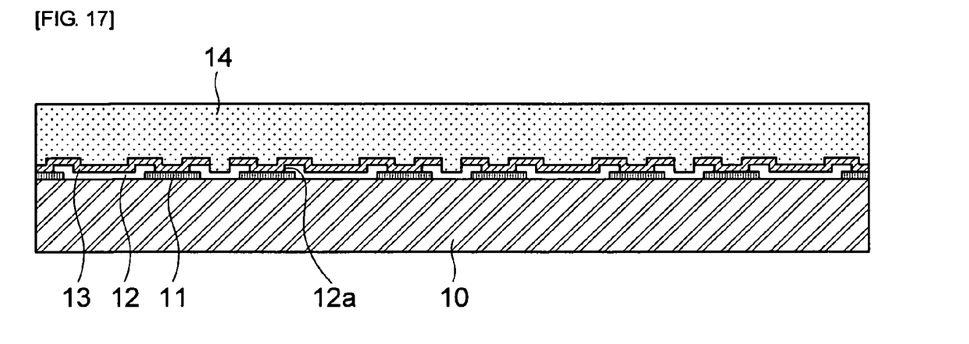

Then, as shown in FIG. 17, a molding resin 14 is formed on the entire surface of the wafer 10 including the redistribution line 13.

Figure 18:
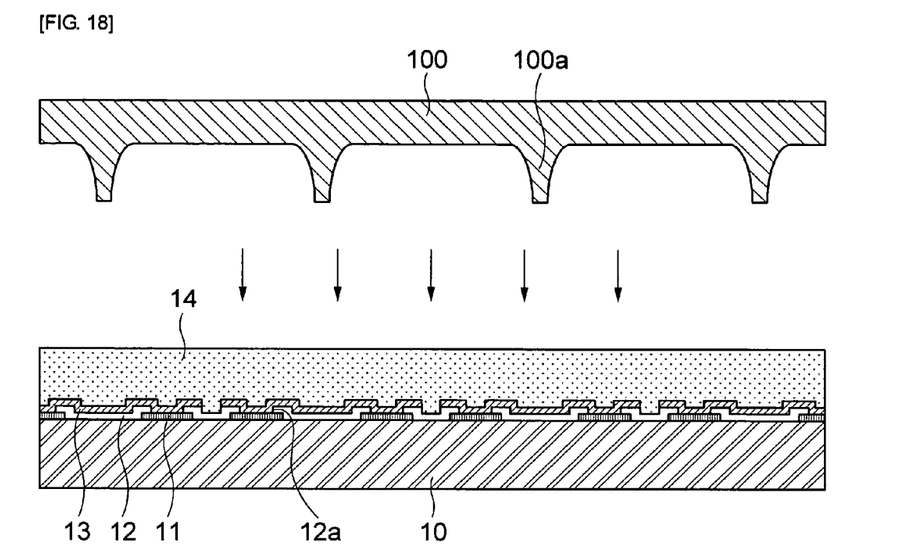
Figure 19:
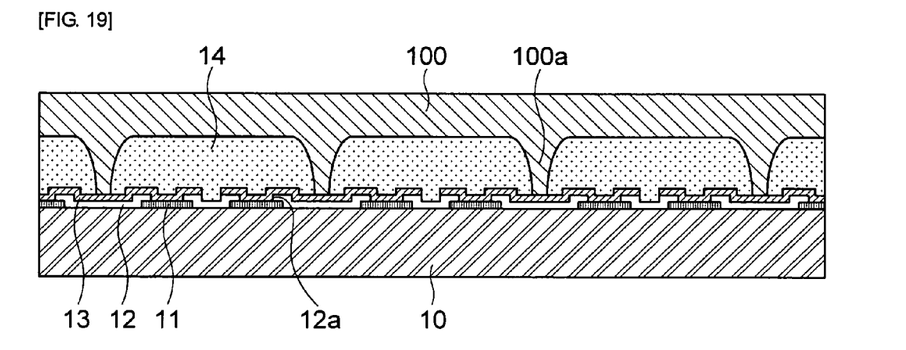

Then, as shown in FIG. 18 and FIG. 19, the molding resin 14 is imprinted by using a mold 100 which includes a plurality of uneven portions 100a of a predetermined shape on the surface.

Herein, the uneven portion 100a of the mold 100 has the same shape as that of the metal post 15 to be formed, for example, it is preferable that a side surface of the uneven portion is curved and the uneven portion is spread upward.

Figure 20:
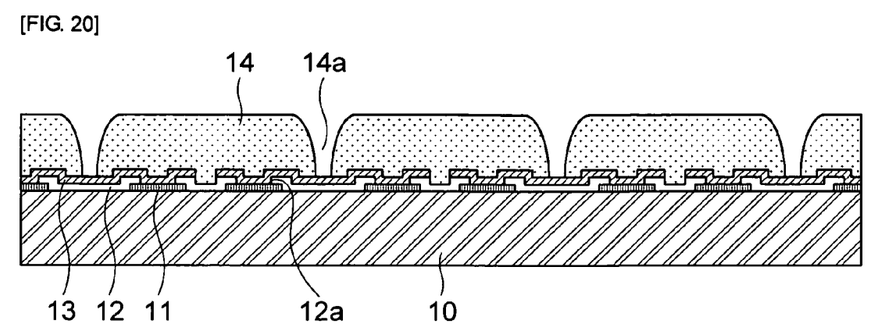

After the imprinting process is completed, as shown in FIG. 20, a metal post filling space 14a, which exposes a portion of the top surface of the redistribution line 13, has a curved side surface, and is spread upward, may be prepared in the molding resin 14.

Then, after performing a demolding process to remove the mold 100, the molding resin 14 is cured.

Figure 21:
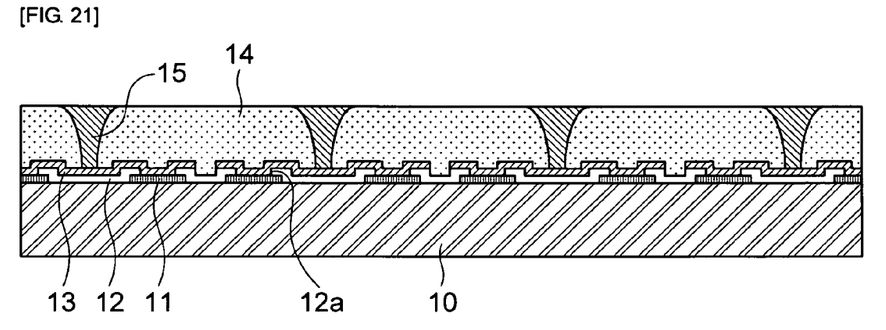

Then, as shown in FIG. 21, the metal posts 15 are formed by plating the metal post filling spaces 14a with the metal.

As described above, the metal post 15 can play a role of a buffer to deformation of the package due to a CTE mismatch between the wafer level package and the wiring substrate and reduce a plating material cost, a lead time, and so on in comparison with a conventional cylindrical metal post by having the curved side surface and being spread upward.

Then, as shown in the above-mentioned FIG. 4, external connection devices 16 for connection to the wiring substrate (not shown) are formed on the top surfaces of the metal posts 15.

As described above, in accordance with the present invention, the wafer level package and the method of manufacturing the same can prevent the deformation of the package due to the CTE mismatch between the wafer level package and the wiring substrate although the height of the metal post is reduced by forming the metal post in the flexure hinge structure of which the central portion is concave or the like, thereby securing the reliability.

Further, the prevent invention can improve the buffering capability to the external impact by forming the metal post in the flexure hinge structure, thereby enhancing the reliability of the drop test of the package or the like.

In addition, the metal post structure of the present invention can reduce the material cost in the plating process for forming the metal post and the time of the plating process by reducing the volume and the height thereof in comparison with the conventional cylindrical structure.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A method for manufacturing a wafer level package comprising:

forming a redistribution line connected to a top surface of a die pad on a wafer with the die pad;

additionally preparing a carrier film including a metal post with a concave central portion on one surface; wherein preparing the carrier film includes separately preparing a first silicon substrate and a second silicon substrate separately forming first and second metal post filling spaces which include curved side surfaces and are spread upward by etching portions of the first and second silicon substrates; forming a silicon mold with a metal post filling space of which a central portion is concave by bonding the first silicon substrate to the second silicon substrate to contact bottom surfaces thereof to each other; adhering a carrier film coated with metal to one surface of the silicon mold; forming a metal post by plating the metal post filling space of the silicon mold with metal; and selectively removing the silicon mold;

bonding the metal post to a top surface of the redistribution line;

molding a space between the metal posts with a molding resin; and removing the carrier film.

2. The method according to claim 1, wherein in the separately forming the first and second metal post filling spaces which include the curved side surfaces and are spread upward by etching the portions of the first and second silicon substrates, the first and second silicon substrates are etched by an RIE (Reactive Ion Etching) method.

3. The method according to claim 1, before forming the redistribution line, further comprising:

forming a protection layer including a via hole to expose a portion of a top surface of a die pad on a wafer with the die pad.

4. The method according to claim 1, after removing the carrier film, further comprising:

forming an external connection device on a top surface of the metal post.

* * * * *